(12) United States Patent
Mattes et al.

(10) Patent No.: US 8,860,592 B2
(45) Date of Patent: Oct. 14, 2014

(54) SIGNAL GENERATING CIRCUIT

(71) Applicant: Infineon Technologies AG, Neubiberg (DE)

(72) Inventors: Heinz Mattes, Munich (DE); Ralf Arnold, Poing (DE); Hermann Obermeir, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/047,997

(22) Filed: Oct. 7, 2013

(65) Prior Publication Data

US 2014/0097976 A1 Apr. 10, 2014

Related U.S. Application Data

(60) Provisional application No. 61/710,396, filed on Oct. 5, 2012.

(51) Int. Cl.
*H03M 1/10* (2006.01)
(52) U.S. Cl.
CPC .................................. *H03M 1/1009* (2013.01)
USPC ............................. 341/120; 341/159; 341/155

(58) Field of Classification Search
CPC ....... H03M 1/1009; H03M 1/12; H03M 1/10; H03M 3/458; H03M 3/38
USPC .......................................... 341/120, 155, 159
See application file for complete search history.

(56) References Cited

U.S. PATENT DOCUMENTS 7,701,376 B2 * 4/2010 Oshima et al. ................. 341/159
7,764,216 B2 * 7/2010 Oshima et al. ................. 341/172

* cited by examiner

*Primary Examiner* — Jean B Jeanglaude
(74) *Attorney, Agent, or Firm* — SpryIP, LLC

(57) ABSTRACT

A signal generating circuit, may include an analog signal generator having an output and a control input, the analog signal generator configured to generate at the output an analog output signal in accordance with a timing parameter; an analog-to-digital converter (ADC) having an input and an output, the input coupled to the output of the analog signal generator, the ADC configured to generate a sequence of signal values dependent on the analog signal received at the input; a configurable digital signal generator comprising an output and a control input, the digital signal generator configured to generate a digital output signal in accordance with signal parameters received at the control input; and a control circuit having an input coupled to the output of the ADC.

7 Claims, 6 Drawing Sheets

......... RISING EDGE PRECHARGE
— — — RISING EDGE MEASUREMENT

SIGNAL GENERATING CIRCUIT

TECHNICAL FIELD

Embodiments of the present invention relate to a signal generating circuit.

BACKGROUND

Analog-to-digital converters (A/D converters, ADCs) are widely used in a plurality of different electronic circuit applications, such as microcontrollers. ADCs serve to convert an analog input signal into a discrete or digital output signal representing the analog input signal. Due to inevitable variations in the manufacturing process of ADCs, ADCs produced in the same process may have different parameters, such as offset or gain. Thus, calibration of an ADC is required before use.

ADCs can be calibrated using special testing or calibration equipment. Such testing equipment, however, is expensive and requires calibration at the end of the fabrication process in the manufacturing plant. On-chip calibration, which means calibration of the ADC only using the circuit where it is employed, or a recalibration some time after the manufacturing process is not possible.

There is, therefore a need for providing a signal processing circuit that allows for on-chip calibration of an ADC.

SUMMARY

A first embodiment relates to a signal generating circuit. The signal generating circuit includes an analog signal generator, an analog-to-digital converter (ADC), a configurable digital signal generator, and a control circuit. The analog signal generator includes an output and a control input and is configured to generate at the output an analog output signal in accordance with a timing parameter. The ADC includes an input coupled to the output of the analog signal generator, and an output. The ADC is configured to generate a sequence of signal values dependent on the analog signal received at the input. The configurable digital signal generator includes an output and a control input. The digital signal generator is configured to generate a digital output signal in accordance with signal parameters received at the control input. The control circuit includes an input coupled to the output of the ADC, a first control output coupled to the control input of the analog signal generator, and a second control output coupled to the control input of the digital signal generator. The control circuit is configured in a calibration routine to have the analog signal generator generate an analog output signal, to determine the timing parameter of the analog output signal based on an output signal of the ADC received at the input of the control circuit, and to set signal parameters of the digital signal generator dependent on the determined timing parameter of the analog signal generator.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 3 that includes

DETAILED DESCRIPTION

In the following detailed description, reference is made to the accompanying drawings, in which is shown by way of illustration specific embodiments in which the invention may be practiced. It is to be understood that the features of the various exemplary embodiments described herein may be combined with each other, unless specifically noted otherwise.

Figure 1:
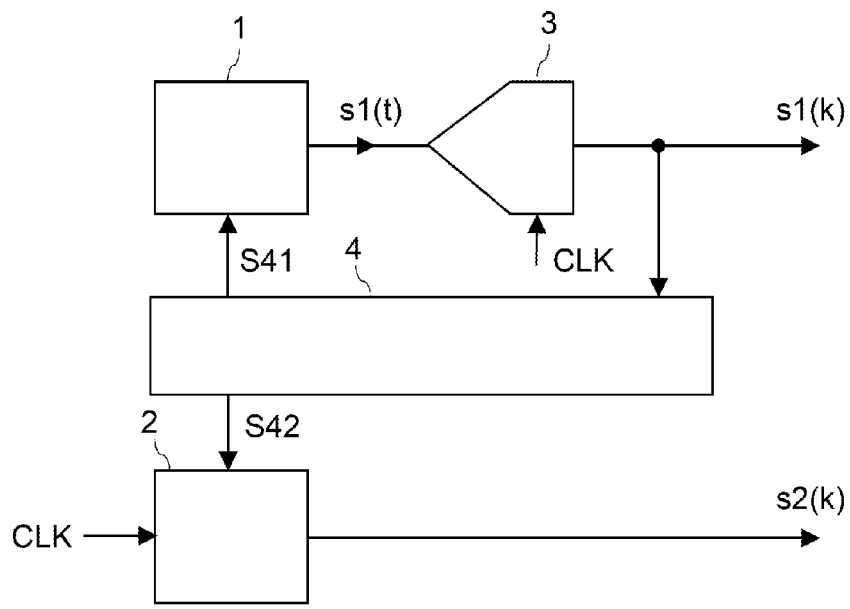
FIG. 1 illustrates a block diagram of a signal generating circuit with an analog signal generator, an analog-to-digital converter (ADC), a digital signal generator and a control circuit.

FIG. 1 illustrates a first embodiment of a signal generating circuit. The signal generating circuit includes an analog signal generator 1 having an output and a control input. The analog signal generator 1 is configured to generate at the output an analog output signal $s1(t)$ in accordance with a timing parameter and is configured to receive a control signal S41 at the control input. The signal generating circuit further includes an analog-to-digital converter (ADC) 3 including an input coupled to the output of the analog signal generator 1 to receive the analog output signal $s1(t)$ from the analog signal generator 1. The ADC 3 further includes an output and is configured to generate a digital (discrete) output signal $s1(k)$. The digital output signal $s1(k)$ includes a sequence of signal values that are dependent on the analog signal $s1(t)$ received at the input of the ADC 3.

The signal generating circuit further includes a configurable digital signal generator 2 including a control input and an output and configured to generate a digital (discrete) output signal $s2(k)$ at the output in accordance with signal parameters S42 received at the control input. A control circuit 4 includes an input coupled to the output of the ADC 3, a first control output coupled to the control input of the analog signal generator 1, and a second control output coupled to the control input of the digital signal generator 2. The control circuit 4 generates a first control signal S41 for the analog signal generator 1 at the first output and a second control signal S42 for the digital signal generator 2 at the second output. The control circuit 4 is configured, in a calibration routine, to have the analog signal generator 1 generate an output signal, to determine the timing parameter of the analog output signal $s1(t)$ based on an output signal $s1(k)$ of the ADC 3 received at the input of the control circuit, and to set the signal parameters S42 of the digital signal generator 2 dependent on the determined timing parameter of the analog signal generator 1.

The signal generating circuit of FIG. 1 is a self-calibrating circuit in which the digital signal generator 2 generates a digital output signal s2(k) having the same timing parameter or the same timing behavior as the analog output signal s1(t) of the analog signal generator 1. As will become apparent from the explanation below, the control circuit 4 is configured to evaluate the timing parameter of the analog output signal s1(t) independent of possibly varying parameters of the ADC 3, such as offset or gain. Thus, variations of these parameters do not affect the evaluation of the timing parameter. The signal generating circuit of FIG. 1 is, therefore, suitable to be employed in a testing circuit for testing an ADC, such as the ADC of FIG. 1. In such a testing circuit the output signal s1(k) of the ADC 3 can be compared with the output signal s2(k) of the digital signal generator 2 in order to calibrate the ADC 3.

According to one embodiment, the analog signal generator 1 is configured to generate the analog output signal s1(t) with a first signal waveform or with a second signal waveform dependent on the control signal S41 received from the control circuit 4. One of the first and second signal waveforms includes a rising edge of the output signal s1(t), and the other one of the first and second signal waveforms includes a falling edge of the output signal s1(t). Both, the first and second signal waveforms are generated in accordance with the timing parameter.

Figure 2:
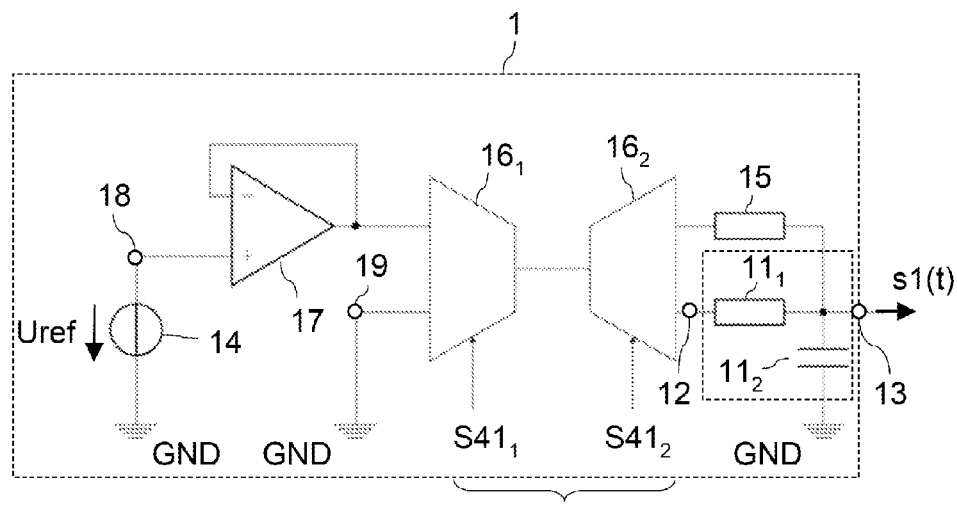
FIG. 2 illustrates a first embodiment of the analog signal generator.

FIG. 2 illustrates a first embodiment of the analog signal generator 1. Referring to FIG. 2, the analog signal generator 1 includes an RC circuit 11 with a resistor $11_1$ and a capacitive storage element $11_2$ connected in series between an input 12 of the RC circuit 11 and a terminal for a reference potential GND. The RC circuit 11 further includes an output 13 coupled to the output of the analog signal generator 1 for providing the analog output signal s1(t). The output of the RC circuit 13 is a circuit node common to the resistor $11_1$ and the capacitive storage element $11_2$. The output signal s1(t) corresponds to a voltage across the capacitive storage element $11_2$ in this embodiment.

Referring to FIG. 2, the analog signal generator 1 further includes a first supply terminal 18 configured to receive a first supply potential, and a second supply terminal 19 configured to receive a second supply potential. In the embodiment illustrated in FIG. 2, the first supply potential Uref at the first supply terminal 18 is provided by a supply voltage source 14 connected between the first supply terminal 18 and the terminal for the reference potential GND. The second supply terminal 19 is connected to the terminal for the reference potential GND in this embodiment. For explanation purposes it is assumed that the first supply potential is a positive potential relative to the reference potential GND. Optionally, an amplifier or buffer 17 is connected to the first supply terminal 18. The gain of the optional amplifier or buffer 17 is 1 (one) according to one embodiment.

The analog signal generator 1 further includes a first multiplexer $16_1$ with a first input terminal coupled to the first supply terminal 18, a second input terminal coupled to the second supply terminal 19, and with an output. The optional buffer 17 is connected between the first supply terminal 18 and the first input of the first multiplexer $16_1$. A second multiplexer $16_2$ has an input terminal coupled to the output terminal of the first multiplexer $16_1$, a first output terminal coupled to the input 12 of the RC circuit 11 and a second output terminal coupled to the capacitive storage element $11_2$ through the output 13 of the RC circuit 11. An optional resistor 15 with a resistance smaller than a resistance of the resistor $11_1$ of the RC circuit 11 is coupled between the second output of the second multiplexer $16_2$ and the capacitive storage element $11_2$. This further resistance 15 only serves to limit the amplitude of a current flowing into the capacitive storage element $11_2$ in a certain operation mode of the analog signal generator 1.

The first and second multiplexers $16_1$, $16_2$ are controlled by the control circuit (4 in FIG. 1) through the control signal S41. In this embodiment, the control signal S41 includes two sub-signals, namely a first sub-signal $S41_1$ controlling the first multiplexer $16_1$, and a second sub-signal $S41_2$ controlling the second multiplexer $16_2$.

Under control of the control circuit 4, the analog signal generator 1 is configured to generate the analog output signal s1(t) with a first signal waveform including a rising edge, or with a second signal waveform including a falling edge. For generating the first signal waveform the capacitive storage element $11_2$ of the RC circuit 11 is precharged to have a first starting voltage and is then charged, so that the voltage across the capacitive storage element $11_2$ and, therefore, the output signal s1(t) increases. For generating the second signal waveform the capacitive storage element $11_2$ is precharged to have a second starting voltage and is then discharged, so that the voltage across the capacitive storage element $11_2$ and the output signal s1(t) decreases. The first starting voltage is lower than the second starting voltage. According to one embodiment, the first starting voltage is zero, while the second starting voltage corresponds to the supply voltage Uref.

Figure 3A:
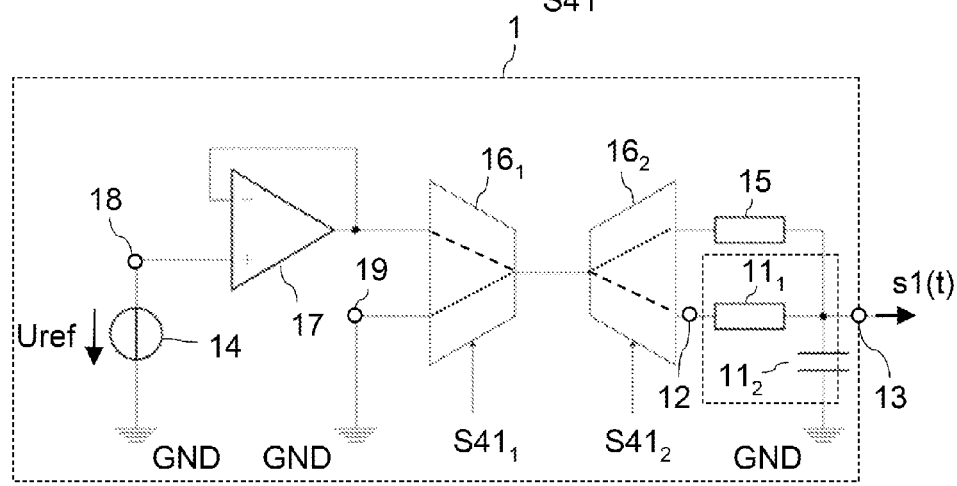
FIGS. 3A and 3B, illustrates the operating principle of the analog signal generator.
Figure 3B:
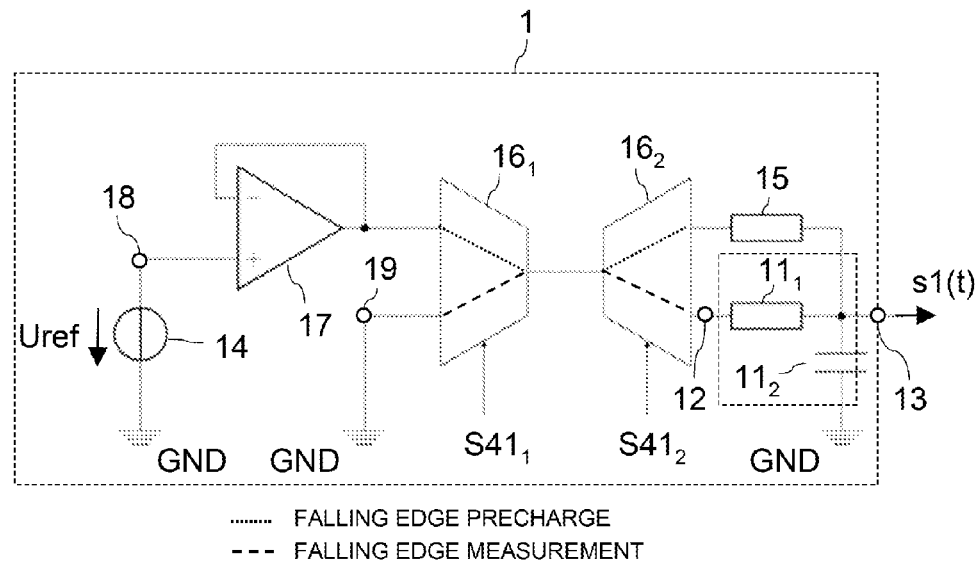

The operating principle of the analog signal generator 1 is explained with reference to FIGS. 3A and 3B below. FIGS. 3A and 3B show block diagrams corresponding to the block diagram of FIG. 2 and further show signal paths through the first and second multiplexers $16_1$, $16_2$ in different operation modes of the analog signal generator 1.

FIG. 3A illustrates the operating principle of the analog signal generator 1 for the generation of the first signal waveform (having a rising edge). Before generating the first signal waveform with the rising edge, the capacitive storage element $11_2$ is pre-charged in a first pre-charge mode to the first starting value by connecting the capacitive storage element $11_2$ to the second supply terminal 19 via the first and second multiplexers $16_1$, $16_2$ and the optional further resistor 15. In this case, the first starting voltage is zero (0). In the first pre-charge mode, the control circuit 4 controls the first multiplexer $16_1$ to connect the second input terminal to the output, and controls the second multiplexer $16_2$ to connect the input to the second output. The signal paths through the multiplexers $16_1$, $16_2$ in the first pre-charge mode are illustrated in dotted lines in FIG. 3A.

After having pre-charged the capacitive storage element $11_2$, the first signal waveform is generated in a charge mode of the analog signal generator 1 by coupling the input 12 of the RC circuit 11 to the first supply terminal 18 through the first and second multiplexers $16_1$, $16_2$. In this operation mode, the control circuit 4 controls the first multiplexer $16_1$ to connect the first input terminal to the output, and controls the second multiplexer $16_2$ to connect the input to the first output. The current paths through the first and second multiplexers $16_1$, $16_2$ in this operation mode are illustrated in dashed lines in FIG. 3A. In this operation mode, the capacitive storage element $11_2$ is charged by the supply voltage source 14 through the resistor $11_1$. In this operation mode in which the capacitive storage element $11_2$ is charged, so as to generate the first signal waveform, the output signal s1(t) can be expressed as follows:

$$s1(t) = Uref \cdot \left(1 - e^{-\frac{(t-t0)}{RC}}\right), \quad (1)$$

where Uref is the supply voltage provided by the supply voltage source 14, t0 is the time at which the RC circuit 11 is connected to the first supply terminal 18, R is the resistance value of the resistor $11_1$, C is the capacitance value of the capacitive storage element $11_2$, and t is the time variable.

Referring to FIG. 1, the slope of the rising edge is dependent on a timing parameter, namely the time constant τ=RC of the RC circuit 11. In the drawings, tau denotes the time constant τ.

FIG. 3B illustrates the operating principle of the analog signal generator 1 for the generation of the second signal waveform (having a falling edge). Before generating the second signal waveform with the falling edge, the capacitive storage element $11_2$ is pre-charged in a second pre-charge mode to the second starting voltage by connecting the capacitive storage element $11_2$ to the first supply terminal 18 via the first and second multiplexers $16_1$, $16_2$ and the optional further resistor 15. In this case, the second starting voltage corresponds to the supply voltage Uref. In this operation mode, the control circuit controls the first multiplexer $16_1$ to connect the first input terminal to the output, and controls the second multiplexer $16_2$ to connect the input to the second output. The signal paths through the multiplexers $16_1$, $16_2$ during the pre-charge phase are illustrated in dotted lines in FIG. 3B.

After having pre-charged the capacitive storage element $11_2$, the second signal waveform is generated in a discharge mode of the analog signal generator by coupling the input 12 of the RC circuit 11 to the second supply terminal 19 through the first and second multiplexers $16_1$, $16_2$. In this operation mode, the control circuit 4 controls the first multiplexer $16_1$ to connect the second input terminal to the output, and controls the second multiplexer $16_2$ to connect the input terminal to the first output. The current paths through the first and second multiplexers $16_1$, $16_2$ in this operation mode are illustrated in dashed lines in FIG. 3B. In this operation mode, the capacitive storage element is discharged through the resistor $11_1$. In this operation mode in which the capacitive storage element $11_2$ is discharged, so as to generate the second signal waveform, the output signal s1(t) can be expressed as follows:

$$s1(t) = Uref \cdot e^{-\frac{(t-t1)}{RC}}, \quad (2)$$

where Uref is the supply voltage provided by the supply voltage source 14, t1 is the time at which the RC circuit 11 is connected to the first supply terminal 18, R is the resistance value of the resistor $11_1$, C is the capacitance value of the capacitive storage element $11_2$, and t is the time variable.

Figure 4:
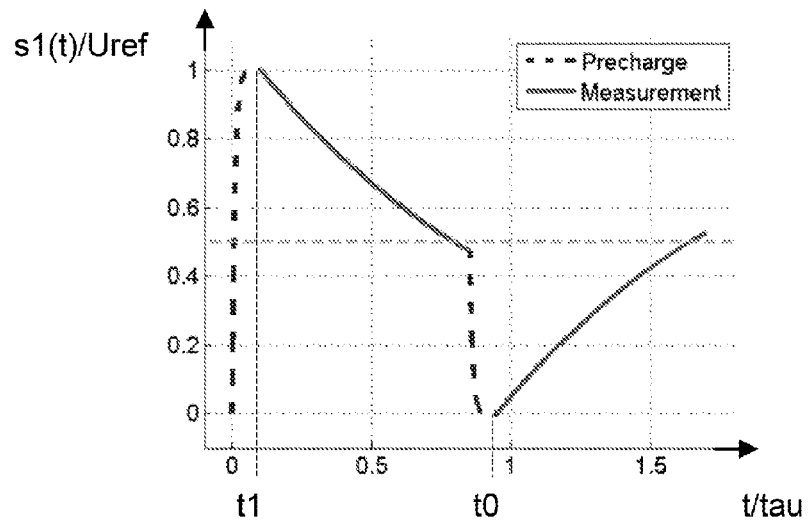
FIG. 4 illustrates an output signal of the analog signal generator during a calibration routine.

FIG. 4 schematically illustrates a timing diagram of the output signal s1(t) over the time t. The amplitude of the output signal s1(t) is normalized to Uref, and the time t is normalized to the time constant τ. Illustrated in FIG. 4 is a sequence with a second pre-charge phase in which the capacitive storage element is charged to the supply voltage Uref, a second signal waveform with a falling edge starting at time t1, a first pre-charge phase, in which the capacitive storage element $11_2$ is discharged, and a first signal waveform with a rising edge. In the embodiment illustrated in FIG. 4, the second signal waveform (with the falling edge) ends when the output signal s1(t) has fallen to a first value that is below 0.5·Uref. This first value is, for example, between 0.4·Uref and 0.49·Uref. The first signal waveform ends, when the output signal s1(t) has reached a second value that is above 0.5·Uref. This second value is, for example, between 0.51·Uref and 0.6·Uref. As will become apparent from the explanation below, the first signal waveform with an amplitude of between 0 and about 0.5·Uref and the second signal waveform with an amplitude of between Uref and about 0.5·Uref is sufficient to determine the timing parameter of the analog output signal s1(t). This timing parameter is the time constant τ (tau) of the RC circuit in this embodiment. Referring to FIG. 4, the time required to generate one first signal waveform and one second signal waveform is less than 2·τ (two times tau).

In the embodiment illustrated in FIG. 4, the second signal waveform is generated before the first signal waveform. However, this is only an embodiment. The order in which these two waveforms are generated could also be changed.

Figure 5:
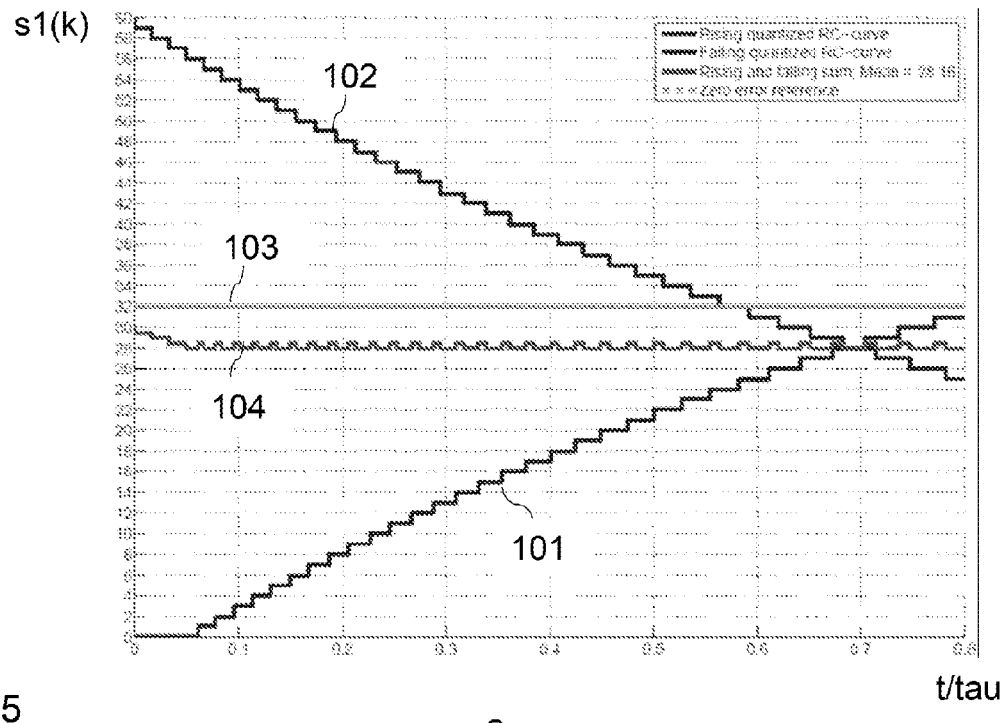
FIG. 5 illustrates output signals of the analog-to-digital converter during the calibration routine.

FIG. 5 schematically illustrates the output signals s1(k) of the ADC 3 resulting from a first signal waveform and from a second signal waveform of the analog output signal s1(t) received at the input of the ADC. In FIG. 5, curve 101 represents the ADC output signal s1(k) resulting from the first signal waveform with the rising edge and curve 102 represents the ADC output signal s1(k) of the ADC 3 resulting from the second signal waveform with the falling edge. These waveforms will be referred to as first ADC signal waveform and second ADC waveform, respectively. The ADC is an m-bit ADC, so that the signal values of the ADC output signal may vary between 0 and $2^m-1$. According to one embodiment, m=6. In this case the signal values vary between 0 and 63.

The time scales of the first and second ADC signal waveforms of FIG. 5 are normalized to τ (tau) and are drawn to each start at 0 (while in the analog signal s1(t) the first and second signal waveforms are, of course, generated subsequently). Referring to FIG. 5, the first ADC signal waveform 101 starts at s1(0)=0 and increases in accordance with an exponential curve. In case of an ADC without offset and gain error, the second ADC signal waveform starts at $s1(0)=2^m-1$ and decreases in accordance with an exponential waveform. In case of a non-ideal ADC, that is in case of an ADC having at least one of an offset error and a gain error, the second signal waveform starts at a value s1(0) that is close the start value s1(0) in the ideal case.

The control circuit 4 is configured to determine the time constant τ=RC from signal values of the ADC output signal s1(k) in the first AC signal waveform and the second AC signal waveform. For this, the control circuit 4 first controls the analog signal generator 1 to generate a signal sequence with one first signal waveform and one second signal waveform, such as illustrated in FIG. 4. For explanation purposes it is assumed, that the time duration for which the first signal waveform is generated equals the time during for which the second signal waveform is generated, that generating the first signal waveform starts when the capacitor $11_2$ has been completely discharged to zero, and that generating the second signal waveform starts when the capacitor $11_2$ has been completely charged to a voltage corresponding to the supply voltage Uref. The control circuit then calculates a mean value $s1_M$ based on the output signal s1(k) of the ADC 3 during the first time period when the first signal waveform is generated and during the second time period when the second signal waveform is generated. That is, the control circuit calculates the mean value based on the signal values of the output signal s1(k) that includes a sequence with the first signal waveform and the second signal waveform as illustrated in FIG. 4.

When employing an ADC 3 with no offset and no gain error, the result of this calculation is a digital value corresponding to a digital value obtained when applying an input signal of 0.5·Uref to the input of the ADC. When, for example, a 6-bit-ADC with a maximum output value of 64 is employed, the calculated mean value would be 32. This mean value is illustrated in FIG. 5 as curve 103. When, however, the ADC includes an offset and/or a gain error, the calculated mean value is offset to the ideal mean value as, e.g., illustrated by curve 104 in FIG. 4. This offset, however, does not affect the calculation of the time constant τ (tau) as will be explained in the following.

Having calculated the mean value $s1_M$, the control circuit 4 calculates the time period $T_\tau$ between the beginning of one of the first and second ADC signal waveforms and the time when the corresponding waveform reaches the calculated mean value $s1_M$.

According to one embodiment, calculating the time period $T_\tau$ includes calculating four time periods. In the first signal waveform 101 a first time period and a second time period is calculated. The first time period $T_{\tau 1}$ is the time period between the time when the first signal waveform starts (this is time t0 in the explanation provided before) and a time when the first signal waveform 101 reaches the highest value that is smaller than the calculated mean value $s1_M$. The second time period $T_{\tau 2}$ is the time period between the time when the first signal waveform starts and a time when the first signal waveform 101 reaches the smallest value that is higher than the calculated mean value $s1_M$. In the second signal waveform 102 a third time period and a fourth time period is calculated. The third time period $T_{\tau 3}$ is the time period between the time when the second signal waveform starts (this is time t1 in the explanation provided before) and a time when the second signal waveform 102 reaches the smallest signal value that is higher than the calculated mean value $s1_M$. The fourth time period $T_{\tau 4}$ is the time period between the time when the second signal waveform starts and a time when the second signal waveform 102 reaches the highest signal value that is smaller than the calculated mean value $s1_M$. The time period $T_\tau$ is calculated to be the mean value of the four time periods, so that:

$$T_\tau = \frac{T_{\tau 1} + T_{\tau 2} + T_{\tau 3} + T_{\tau 4}}{4}. \tag{3}$$

From this time period $T_\tau$, the time constant can be calculated as follows:

$$\tau = -\frac{T_\tau}{\ln(0,5)}. \tag{4}$$

It can be shown that the time constant τ (tau) obtained through this method is independent of an offset or a gain error of the ADC. The division of $T_\tau$ by ln(0.5) in equation (3) can easily be explained using equations (1) and (2). In both cases, in case of the first signal waveform and in case of the second signal waveform, ln(0.5)·τ is the time period between the beginning of the corresponding signal waveform and the time when the corresponding signal waveform equals 0.5·Uref, i.e.

$$s1(t) = u_{OFFSET} + g \cdot Uref \cdot e^{-\frac{(T_\tau)}{RC}} \tag{5}$$
$$= u_{OFFSET} + g \cdot Uref \cdot \left(1 - e^{-\frac{(T_\tau)}{RC}}\right)$$
$$= 0.5 \cdot Uref.$$

0.5·Uref is the mean value of the sum of the signal values of the first signal waveform according to equation (1) and of the signal values of the second signal waveform according to equation (2). This mean value is represented by the calculated mean value $s1_M$ represented by curve 104 in FIG. 5. In equation (5), $u_{OFFSET}$ denotes an offset error and g denotes a gain of the ADC. As can be seen from equation (5), the calculation of the time constant τ is independent of the offset and the gain.

Figure 6:
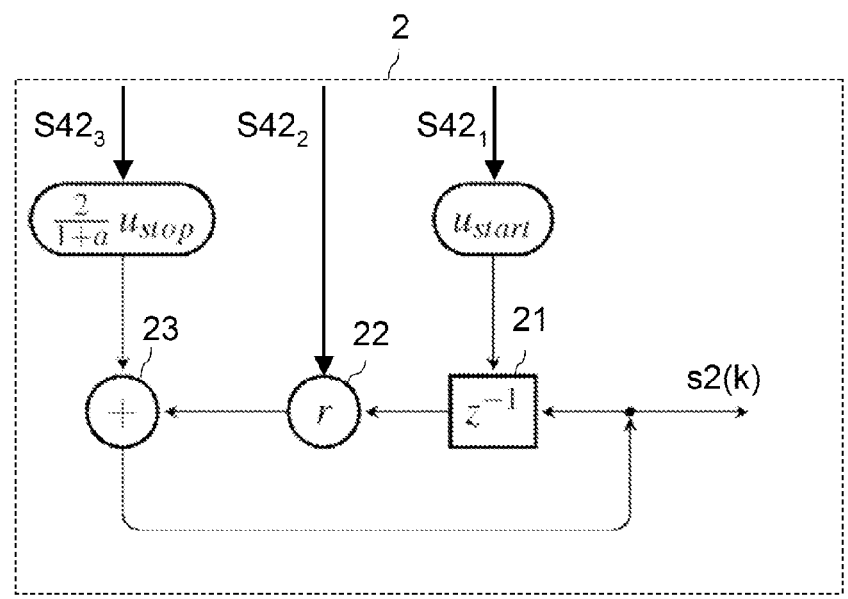
FIG. 6 illustrates a digital signal generator according to a first embodiment.

FIG. 6 illustrates a first embodiment of a digital signal generator 2 controlled by the control circuit 4 so as to generate a digital output signal s2(k) in accordance with the time constant τ of the analog signal generator 1. Referring to FIG. 6, the digital signal generator 2 includes a register 21, a multiplier 22 and an adder 23. An output of the adder 23 is fed back to an input of the register 21. An output of the register 21 is coupled to the multiplier 22 that multiplies the output of the register 21 with a constant signal value r. The adder 23 adds a constant value 2·$u_{STOP}$/(1+a) to the output signal of the register. A start value $u_{START}$ of the register 21, the constant value r and the constant value 2·$u_{STOP}$/(1+a) added to the output signal of the multiplier 22 are received from the control circuit 4 in FIG. 6. In FIG. 6, signals $S42_1$, $S42_2$, $S42_3$ represent sub-signals of the control signal S42 of the control circuit 4, with these sub-signals including the signal parameters.

The digital signal generator 2 of FIG. 6 is operated in a clocked fashion as follows: In a first clock cycle, which can be referred to as an initialization cycle, the start value $u_{START}$ is fed into the register 21. In a second clock cycle the value stored in the register 21 is multiplied with the constant value r, the constant value 2·$u_{STOP}$/1+a is added to the value obtained through the multiplication, and the result is stored in the register 21. The operations performed in the second clock cycle are repeated in each of the subsequent clock cycles, that is, the process of multiplying the constant of the register 21 with r, adding the constant value 2·$u_{STOP}$/1+a to the result of the multiplication process and feeding back the output signal of the adder 23 to the register 21 is repeated in each of the clock cycles following the second clock cycle.

The parameters provided to the digital signal generator 2 from the control circuit 4 are as follows:

$$a = \frac{\tau}{T_2}, \tag{6a}$$

$$r = \frac{2\tau - T_2}{2\tau + T_2}, \tag{6b}$$

where τ is the calculated time constant, and $T_2$ is the duration of one clock period of the digital signal generator. The clock periods of the digital signal generator 2 are synchronized with the clock periods of the ADC 3. For this, referring to FIG. 1, the ADC and the digital signal generator receive the same clock signal CLK from a clock generator (not shown in FIG. 1).

The start value $u_{START}$ and the stop value $u_{STOP}$ are different dependent on whether a rising edge of the digital output signal s2(k) is to be generated or a falling edge of the digital output signal s2(k) is to be generated. In case of a rising edge:

$$u_{START} = 0, \quad (7a)$$

$$u_{STOP} = \frac{2 \cdot T_2}{T_2 + \tau}. \quad (7b)$$

In case of a falling edge:

$$u_{START} = 1 \quad (8a),$$

$$u_{STOP} = 0 \quad (8b).$$

After the calibration process has been performed, the control circuit 4 is configured to synchronously control the analog signal generator 1 and the digital signal generator 2 to generate output signals with corresponding waveforms. e.g. the control circuit 4 controls the analog signal generator 1 and the digital signal generator to generate the analog and digital output signals s1(t), s2(k) with corresponding waveforms. E.g., the control circuit 4 controls the analog signal generator 1 to generate the analog output signal s1(t) with the first signal waveform including a rising edge, and synchronously controls the digital signal generator 2 to generate the digital output signal s2(k) with a rising edge. The analog signal generator 1 and the digital signal generator 2 can be controlled as explained herein before through the control signals S41, S42 provided by the control circuit 4. The analog output signal s1(t) of the analog signal generator 1 and the digital output signal s2(k) have the same timing behavior, because the digital signal generator 2 has been calibrated using the time constant of the analog signal generator 1. When the ADC 3 is an ideal ADC that does not include an offset and that does not include a gain error, the digital output signal s1(k) of the ADC 3, corresponds to the digital output signal s2(k) of the digital signal generator. When, however, the ADC 3 is not ideal and includes one of an offset and a gain error, the digital output signal s2(k) of the digital signal generator 2 can be used to determine the error occurring in the ADC and can be used to calibrate the ADC 3.

The signal generating circuit of FIG. 1 can be implemented in many different ways. According to one embodiment, the analog signal generator 1, the digital signal generator 2, the control circuit 4 and the ADC 3 are implemented in a common semiconductor chip. According to a further embodiment, the control circuit 4 is implemented in one semiconductor chip and the other components of the signal generating circuit are implemented in a further semiconductor chip. The control circuit 4 can be implemented with a microprocessor, a CPU, or could even be implemented as an ASIC (application specific integrated circuit).

The block diagrams of the analog signal generator of FIG. 2 and of the digital signal generator of FIG. 6 illustrate the functionality of these signal generators, rather than their specific implementation. These signal generators can be implemented in many different ways using conventional integrated or discrete circuit devices.

Figure 7:
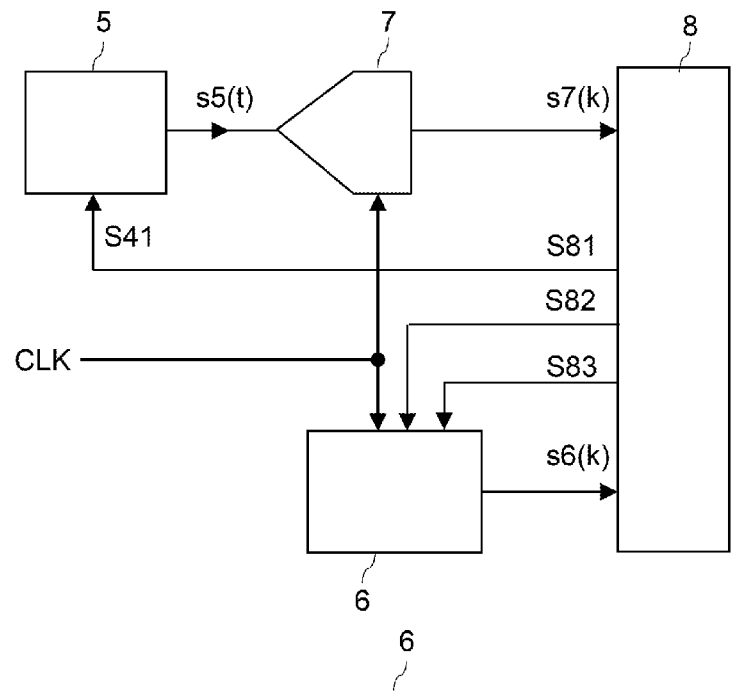
FIG. 7 illustrates a block diagram of a test circuit including an analog signal generator, an ADC, a configurable digital signal generator and an evaluation unit.

FIG. 7 illustrates one embodiment of a test circuit for testing an analog-to-digital converter (ADC). The test circuit includes an analog signal generator 5 including an output and configured to generate an output signal s5(t) in accordance with a timing parameter at the output. The test circuit further includes an ADC 7 to be tested. The ADC 7 includes an input connected to the output of the analog signal generator 5, and an output. The ADC 7 is configured to generate a first digital output signal S7(k) dependent on the analog input signal s5(t). The test circuit further includes a configurable digital signal generator 6 including an output and configured to generate a second digital output signal in accordance with the timing parameter of the analog output signal S5(t). The digital signal generator is configured to receive at least one adjustment signal S83 and is configured to adjust at least one of an offset and an amplitude of the digital output signal s6(k) dependent on the at least one adjustment signal. An evaluation circuit 8 receives the first digital output signal s7(k) from the ADC and the second digital output signal s6(k) from the digital signal generator 6. The evaluation circuit 8 is configured to compare the first digital signal s7(k) and the second digital signal s6(k) and is configured to determine at least one error parameter of the ADC 7 based on the comparison.

The analog signal generator 5 that is configured to generate the analog output signal s5(t) in accordance with a timing parameter, can be implemented like the analog signal generator 1 explained with reference to FIGS. 1 and 2. The analog signal generator 5 receives a control signal S81 from the evaluation circuit 8. This control signal S81 may correspond to the control signal S41 explained with reference to FIGS. 1 and 2 and serves to control the analog signal generator 5 to generate the output signal s5(t) either with a first signal waveform including a rising edge, or a second signal waveform including a falling edge.

The timing parameter in accordance to which the digital signal generator 6 generates the second digital signal s6(k) is dependent on signal parameters S82 received from the evaluation circuit 8. The evaluation circuit 8 may include a control circuit corresponding to the control circuit 4 explained with reference to FIGS. 1 to 6 hereinbefore. This control circuit included in the evaluation circuit 8 is configured, in a calibration routine, to determine the timing parameter of the analog output signal s5(t) based on the first digital signal s7(k) and to adjust the signal parameters S82 in accordance with the method explained with reference to FIGS. 1 to 6 hereinbefore. Referring to the explanation provided hereinbefore, the signal parameter S82 may vary, dependent on whether an analog signal s5(t) and a corresponding second digital signal s6(k) with a first signal waveform or with a second signal waveform are generated.

Figure 8:
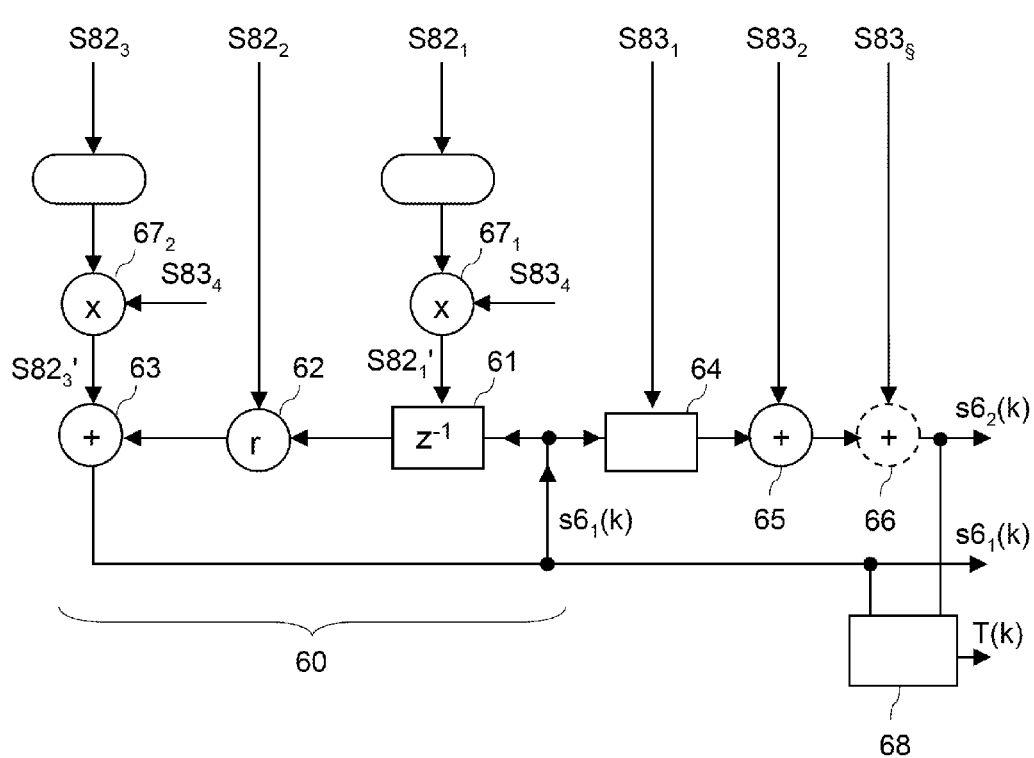
FIG. 8 illustrates one embodiment of the digital signal generator.

FIG. 8 illustrates one embodiment of the digital signal generator 6. The signal generator includes a signal generating unit 60 that is implemented like the signal generator 2 of FIG. 6 and includes a register 61, a multiplier 62 connected downstream the register 61, and an adder 63 connected downstream the multiplier 62. An output of the adder 63 is fed back to the input of the register 61. The signal generator 6 receives three signal parameters $S82_1$, $S82_2$, $S82_3$ that correspond to the signal parameters $S42_1$, $S42_2$, $S42_3$, respectively, explained with reference to FIG. 6. The first and third signal parameters $S82_1$, $S82_3$ can be modified in a way explained in further detail herein below. A modified first signal parameter $S82_1'$ that is dependent on the first signal parameter $S82_1$ is received by the register 61, and a modified third signal parameter $S82_3'$ that is dependent on the third signal parameter $S82_3$ is received by the adder 63.

The signal generating unit 60 generates a digital output signal $s6_1(k)$ dependent on the first, second and third signal parameters $S82_1$, $S82_2$, $S82_3$. This output signal $s6_1(k)$, like the digital signal s2(k) explained herein before is a clocked signal that changes its signal value with each clock cycle. The clock cycle is defined by an external clock signal CLK (schematically illustrated in FIG. 7) received by the digital signal generator 6 and the ADC 7.

The analog signal generator 5 and the digital signal generator 6 can by synchronized to generate the analog output signal s5(t) and the digital signal $s6_1(k)$ with either the first signal waveform or the second signal waveform, so that an analog signal s5(t) and a digital signal $s6_1(k)$ with the same timing behavior are generated beginning at the same time. The digital signal generator 6 of FIG. 8 outputs two digital signals, namely the digital signal $s6_1(k)$ (referred to as first digital signal in the following) as generated by the signal generating unit 60, and a second digital signal $s6_2(k)$ that is a modified (adjusted) version of the first digital signal $s6_1(k)$. For generating the second digital output signal $s6_2(k)$ from the first digital output signal $s6_1(k)$, the digital signal generator 6 includes an adjustment circuit. The adjustment circuit is configured to adjust at least one of an amplitude and an offset of the second digital output signal $s6_2(k)$.

Referring to FIG. 8, a fist adjustment unit 64 receives the first digital signal $S6_1(k)$. This first adjustment unit 64 serves to adjust the amplitude of the second output signal $s6_2(k)$ to the amplitude of the ADC output signal $s7(k)$. The operating principle of this first adjustment unit 64 is explained with reference to FIG. 9 below.

Figures 9, 10:
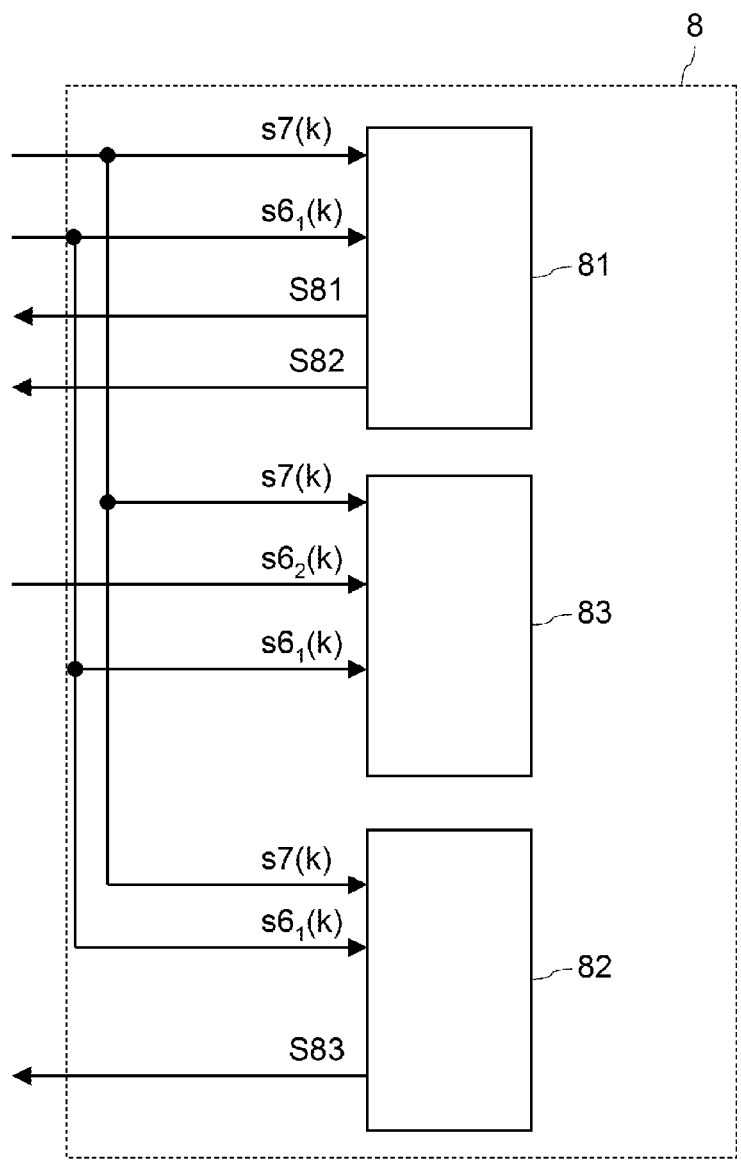
FIG. 9 illustrates the operating principle of a first adjustment unit included in the digital signal generator.
FIG. 10 illustrates an embodiment of the evaluation unit.

For explanation purposes it is assumed that the signal generating unit 60 generates the first output signal $s6_1(k)$ as a sequence of digital words (codes) with a length of q bit, wherein the values of the individual digital words are between 0 and 1, specifically between 0 and $1-2^{-q}$. For explanation purposes it is further assumed, that the ADC 7 is a p-bit ADC, so that the first digital output signal $s7(k)$ includes a sequence of digital words (codes) each having p-bit, wherein p≤q. The signal values of the individual digital words of the first output signal $s7(k)$ are between 0 and $2^p-1$. In order to adapt the amplitude of the digital signal $s6_1(k)$, which is between 0 and 1, to the amplitude of the digital ADC output signal $s7(k)$, which is between 0 and $2^p-1$, the first adjustment unit 64 may simply perform a bit shift operation as illustrated in FIG. 9. In FIG. 9, $s6_1(i)$ denotes an arbitrary digital word of the sequence of digital words represented by the digital signal $s6_1(k)$ In the embodiment illustrated in FIG. 9, q=8. The binary digital word illustrated in FIG. 9 is $0.11011001_2$, which corresponds to the decimal value $0.84765625_{10}$ ($=1\cdot2^{-1}+1\cdot2^{-2}+0\cdot2^{-3}+1\cdot2^{-4}+1\cdot2^{-5}+0\cdot2^{-6}+0\cdot2^{-7}+1\cdot2^{-8}$).

The corresponding digital code of the second output signal $s6_2(i)$ is obtained by simply shifting the comma for q positions to the right, where q=4 in the embodiment illustrated in FIG. 9. The resulting digital word is $1101.1001_2$, which corresponds to the decimal value 13.5625 ($=1\cdot2^3+1\cdot2^2+0\cdot2^1+1\cdot2^0+1\cdot2^{-1}+0\cdot2^{-2}+0\cdot2^{-3}+1\cdot2^{-4}$). The bit shift operation explained with reference to FIG. 9 is performed by the first adjustment unit 64. The parameter p is defined by a first adjustment parameter $S83_1$ the first adjustment unit 64 receives from the evaluation unit 8. This parameter p is dependent on the specific type of ADC 7 to be tested.

Referring to FIG. 8, the adjustment circuit further includes a second adjustment unit 65 that is configured to adjust an offset of the second output signal $s6_2(k)$. The second adjustment unit 65 is connected downstream the first adjustment unit 64 and is configured to add a second adjustment parameter $S83_2$ to the output signal of the first adjustment unit 64. The second adjustment parameter $S83_2$ represents an offset of the ADC 7.

Referring to FIG. 8, the adjustment circuit further includes an optional third adjustment unit 66 (illustrated in dashed lines) that receives a third adjustment parameter $S83_3$ from the evaluation circuit 8. The third adjustment parameter $S83_3$ may assume one of two different parameter values, namely 0 or 0.5. This value is dependent on the type of the ADC 7 to be tested. When the ADC 7 is an ADC of a "true zero riser" type, the third adjustment parameter $S82_3$ is 0.5·LSB, while the third adjustment parameter $S82_3$ is 0, when the ADC 7 is an ADC of a "non true zero riser" type.

While in the embodiment of FIG. 8, the third adjustment unit 66 is downstream the second adjustment unit 65, the positions of the second and third adjustment units 65, 66 could also be changed, so that the second adjustment unit 65 would be downstream the third adjustment unit 66.

Referring to FIG. 8, a fourth adjustment unit 67 receives a fourth adjustment parameter $S83_4$ from the evaluation circuit 8. The fourth adjustment parameter $82_4$ represents a gain error of the ADC 7 and multiplies the first parameter signal $S82_1$ that represents a start value of the register 61 and the second parameter signal $S82_3$ with the fourth adjustment parameter $S83_4$. The fourth adjustment unit 67 includes a first multiplier $67_1$ multiplying the first parameter signal $S82_1$ with the fourth adjustment parameter $S83_4$, and a second multiplier $67_2$ multiplying the third parameter signal $S82_3$ with the fourth adjustment parameter $S82_4$.

FIG. 10 illustrates one embodiment of the evaluation circuit 8. The evaluation circuit of FIG. 8 includes a control circuit 81 that may correspond to the control circuit 4 of FIG. 1 and that receives the digital ADC output signal $s7(k)$ and the first digital output signal $s6_1(k)$ of the digital signal generator 6, and that generates the control signal S81 received by the analog signal generator 5 and the signal parameters S82 (that includes sub-parameters $S82_1$, $S82_2$, $S82_3$) to control the analog signal generator 5 and the digital signal generator 6.

The evaluation circuit 8 further includes an adjustment circuit 812 that receives the ADC output signal $S7(k)$ and the first digital output signal $S6_1(k)$ (as illustrated) or the second digital output signal $S6_2(k)$ (not illustrated) and that is configured to generate the adjustment signal S83 (with the sub-signal $S83_1$-$S83_4$ illustrated in FIG. 8).

Figure 11:
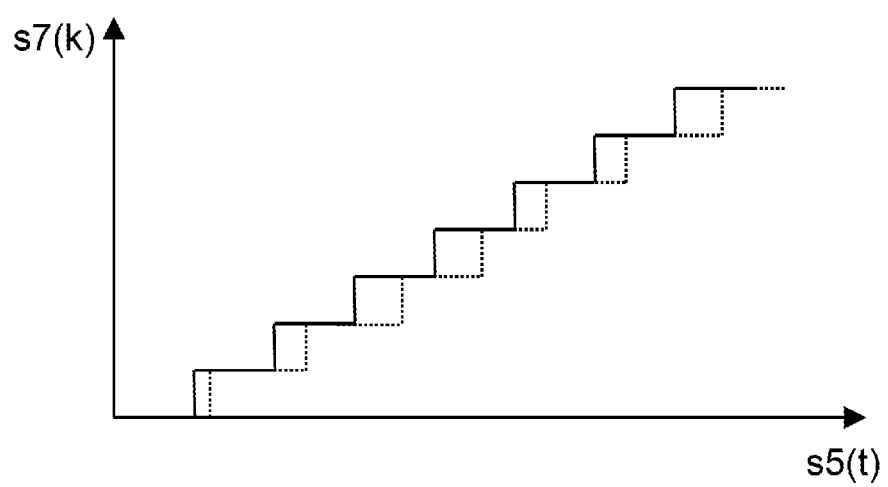
FIG. 11 illustrates characteristic curves of an ideal and a non-ideal ADC.

Besides an offset and a gain error, an ADC, such as ADC 7 of FIG. 7, may include non-linearities. The non-linearities that may occur are illustrated in FIG. 11. FIG. 11 illustrates the transfer characteristics of an ideal ADC, which is an ADC that is not subject to non-linearities, and the transfer characteristic of an ADC that is subject to non-linearities. The transfer characteristic of the ideal ADC is illustrated in solid lines in FIG. 11, while the transfer characteristic of the non-ideal ADC is illustrated in dotted lines in FIG. 11. Referring to FIG. 11, the transfer characteristic of an ADC shows the output signal of the ADC, such as the output signal $s7(k)$ of the ADC 7 of FIG. 7, dependent on the input signal, such as the analog input signal $s5(t)$ of FIG. 7. The transfer characteristic includes a plurality of steps, with the individual steps having the same height. In an ideal ADC, the individual steps have the same width, where the width is dependent on the resolution of the ADC. In general, the step width is given by the maximum output signal divided by $2^p$, where p is the length of the digital words of the ADC output signal $s7(k)$. In an ADC that is subject to non-linearities, the width of the individual steps may vary. This variation of the step width results in two different errors, known as differential non-linearity (DNL) error and integral non-linearity (INL) error. Each step of the transfer characteristic has an INL error and a DNL assigned thereto. The INL error is the difference between the input signal value at which the transition of the ideal transfer characteristic occurs and the input signal value at which the corresponding transition of the non-ideal transfer characteristic occurs. The maximum INL error occurring in the transfer characteristic is the INL error of the ADC. The DNL error is the difference between the width of one step of the ideal transfer characteristic and the width of the corresponding step of the non-ideal transfer characteristic. The maximum DNL error occurring in the transfer characteristic is the DNL error of the ADC.

Referring to the explanation above, the evaluation circuit 8 can be configured to have the analog signal generator 5 generate an analog signal s5(t) with a given timing parameter and with either a falling or a rising edge, and to have the digital signal generator 6 generate the corresponding digital output signal s6$_1$(k), s6$_2$(k) with a corresponding timing parameter. In particular the second output signal s6$_2$(k) is not only dependent on the timing parameter, but in generating the second output signal s6$_2$(k) the digital signal generator 6 already takes into account the solution of the ADC 7 in the first adjustment unit 64, the offset of the ADC 7 in the second adjustment unit 65, the type of ADC 7 (true zero riser, or non true zero riser) in the optional third adjustment unit 66, and the gain of the ADC 7 in the fourth adjustment unit 67$_1$, 67$_2$. The second output signal s6$_2$(k), therefore corresponds to the output signal s7(k) of the ADC in those cases in which the ADC has an offset and a gain error, but is free of an INL and DNL error. Thus, by suitably evaluating the second output signal s6$_2$(k) of the digital signal generator and the output signal s7(k) of the ADC 7, the INL and DNL errors of the ADC can be determined. For this, the evaluation circuit 8 includes a test unit 83. The test unit 83 receives the ADC output signal s7(k), the first and second output signals s6$_1$(k), s6$_2$(k) of the digital signal generator 6, and a step signal T[s6(k)].

The step signal is provided by a step detector in the digital signal generator 6. The step detector receives the first output signal s6$_1$(k) and the second output signal s6$_2$(k) and detects whenever the signal value represented by s6$_2$(k) is incremented by 1. Referring to FIG. 9, each data word represented by s6$_2$(k) includes an integer part (the part before the comma) and a non-integer part (the part after the comma). The step detector 68 detects changes of the LSB of the integer part, which means changes of the bit representing $2^0$. Let, s6$_2$(j) be a data word at which the LSB changes, then the output signal of the step detector 68 is the corresponding signal value of the first output signal s6$_1$(k), which is s6$_1$(j). E.g., when s6$_2$(j)= 1011.0000, then the corresponding data word output by the step detector 68 is 0.10110000. The output T(k) of the step detector 68 is constant until a next change of the LSB of the integer part of s6$_2$(k) occurs.

In the mode the analog signal generator generates the analog signal s5(t) with either a rising edge or a falling edge. Just for explanation purposes it is assumed that analog signal s5(t) has a rising edge. In this case, the ADC output signal s7[k] is a sequence of data words each having a length of p bit. According to one embodiment, a new data word is output by the ADC with each clock cycle of the clock signal CLK. Since the analog signal s5(k) increases, the signal value represented by the data words is incremented. The rate at which the value is incremented, which is the rate at which the LSB of the data words changes, is dependent on the slope of the analog signal s5(t).

The test circuit 83 receives the ADC output signal s7(k) and detects the times when the LSB of the data words changes, which is when the data word is incremented. The test circuit 83 further receives the first output signal s6$_1$(k) and the step signal T(k). Let j be a time at which the LSB of the data word s7(k) changes, then s6$_1$(j) represents the input signal of the ADC at that time and T(j) represents the correct (ideal) input signal of the ADC at which the change of the LSB should have occurred. From these three values the INL error and/or the DNL error can be determined.

The invention claimed is:

1. A signal generating circuit, comprising:
   an analog signal generator comprising an output and a control input, the analog signal generator configured to generate at the output an analog output signal in accordance with a timing parameter;
   an analog-to-digital converter (ADC) comprising an input and an output, the input coupled to the output of the analog signal generator, the ADC configured to generate a sequence of signal values dependent on the analog signal received at the input;
   a configurable digital signal generator comprising an output and a control input, the digital signal generator configured to generate a digital output signal in accordance with signal parameters received at the control input;
   a control circuit comprising an input coupled to the output of the ADC, a first control output coupled to the control input of the analog signal generator, and a second control output coupled to the control input of the digital signal generator, the control circuit configured in a calibration routine to have the analog signal generator generate an analog output signal, to determine the timing parameter of the analog output signal based on an output signal of the ADC received at the input of the control circuit, and to set signal parameters of the digital signal generator dependent on the determined timing parameter of the analog signal generator.

2. The signal generating circuit of claim 1,
   wherein the analog signal generator is configured to generate the output signal with a first signal waveform or with a second signal waveform, each in accordance with the timing parameter and dependent on a control signal received from the control circuit at the control input,
   wherein the control circuit in the calibration routine is configured to have the analog signal generator generate the output signal with the first signal waveform at least once and to have the analog signal generator generate the output signal with the second signal waveform at least once.

3. The signal generating circuit of claim 2, wherein the control circuit in the calibration routine is configured:
   to calculate a mean value of the output values of the ADC during at least one first time period when the analog signal generator generates the first signal waveform and during at least one second time period when the analog signal generator generates the second signal waveform,
   to further generate at least one of the first signal waveform and the second signal waveform and to evaluate a time period between the beginning of the at least one first or second signal waveform and a time when the at least one first or second signal waveform reaches the mean value,
   generating the timing parameter dependent on the time period.

4. The signal generating circuit of claim 1, wherein the analog signal generator comprises:
   an RC circuit with a resistor and a capacitor connected in series, wherein the output signal of the analog signal generator is dependent on a voltage across the capacitor;
   a first supply terminal configured to receive a first supply potential and a second supply terminal configured to receive a second supply potential;
   a coupling circuit coupled to the control input of the analog signal generator and configured to couple the first supply terminal or the second supply terminal to the RC circuit, dependent on the control signal received at the control input.

5. The signal generating circuit of claim 4, wherein the coupling circuit is further configured to have the coupling circuit pre-charge the capacitor of the RC circuit dependent on the control signal.

6. The signal generating circuit of claim 5, wherein the control circuit is configured to have the coupling circuit precharge the capacitor to the first supply potential.

7. The signal generating circuit of claim 4, wherein the coupling circuit comprises:
- a first multiplexer having a first input coupled to the first supply terminal, a second input coupled to the second supply terminal, and an output;
- a second multiplexer having an input coupled to the output of the first multiplexer, a first output coupled to an input of the RC circuit, and a second output coupled to the capacitor of the RC circuit.

* * * * *